(12) United States Patent
Kurita et al.

(10) Patent No.: US 6,448,647 B1
(45) Date of Patent: Sep. 10, 2002

(54) BGA PACKAGE SUBSTRATE

(75) Inventors: Hideyuki Kurita, Tokyo; Masahiro Fujimoto, Tochigi, both of (JP)

(73) Assignee: Sony Chemicals Corporation, Tochigi (JP)

( * ) Notice: Subject to any disclaimer, the term of this patent is extended or adjusted under 35 U.S.C. 154(b) by 0 days.

(21) Appl. No.: 09/090,633

(22) Filed: Jun. 4, 1998

(30) Foreign Application Priority Data

Jun. 5, 1997 (JP) .............................................. 9-163442

(51) Int. Cl.$^7$ ................................................ H01L 23/48
(52) U.S. Cl. ..................... 257/738; 257/737; 257/780
(58) Field of Search ................................ 257/619, 623, 257/737, 738, 780; 438/613

(56) References Cited

U.S. PATENT DOCUMENTS

| | | | | |
|---|---|---|---|---|
| 4,807,021 A | * | 2/1989 | Okumura | 357/75 |
| 5,607,099 A | * | 3/1997 | Yeh et al. | 228/180.22 |
| 5,668,386 A | * | 9/1997 | Makiuchi et al. | 257/184 |
| 5,777,382 A | * | 7/1998 | Abbott et al. | 257/695 |
| 5,841,192 A | * | 11/1998 | Exposito | 257/701 |
| 5,844,168 A | * | 12/1998 | Schueller et al. | 174/52.4 |
| 5,844,316 A | * | 12/1998 | Mallik et al. | 257/738 |
| 5,851,911 A | * | 12/1998 | Farnworth | 438/614 |
| 6,046,598 A |   | 8/2000 | Miyaji et al. | 324/755 |

FOREIGN PATENT DOCUMENTS

JP    9-260540    10/1997

OTHER PUBLICATIONS

Notification for Reasons for Refusal from Japanese Patent Office, dated Feb. 20, 2001, 3 pages.

\* cited by examiner

*Primary Examiner*—George C. Eckert, II
(74) *Attorney, Agent, or Firm*—Rosenthal & Osha L.L.P.

(57) ABSTRACT

It is an object of the present invention to provide a BGA package substrate capable of forming a thin and light BGA package which causes no crack in solder balls during temperature cycling tests and which permits fine-pitch packaging.

According to the present invention, a conductive pattern 3 is formed on a solder resist layer 2 made of polyimide and a cover film 4 is formed on the conductive pattern 3. The conductive pattern 3 includes a land 3a for connection to a mother board and a bonding pad 3b for connection to an IC. The solder resist layer 2 has an opening 5 to leave an overlap on the periphery of the land 3a, and an end of the opening 5 is tapered. A solder ball 6 is formed on the land 3a.

6 Claims, 4 Drawing Sheets

BGA PACKAGE SUBSTRATE

BACKGROUND OF THE INVENTION

1. Field of the Invention

The present invention relates to a BGA (Ball Grid Array) package substrate for mounting a semiconductor device such as LSI.

2. Prior Art

In recent years, BGA packages have attracted attention as surface mounting packages for mounting semiconductor devices.

FIG. 4 a schematically shows the structure of a conventional BGA package.

As shown in FIG. 4a, a BGA package 101 is designed to mount a semiconductor device 103 such as an LSI chip on one surface of a printed wiring board 102 and to form solder balls 104 as outer electrodes on the back surface.

In this BGA package 101, bonding wires 105 connected to electrode pads 103a on the semiconductor device 103 are connected to a conductive pattern 106 formed on the printed wiring board 102. This conductive pattern 106 is connected to lands 108a of a conductive pattern 108 formed on the back surface of the printed wiring board 102 through via holes 107 passing through the printed wiring board 102, whereby the electrode pads 103a of the semiconductor device 103 are connected to the solder balls 104.

The BGA package 101 with such a structure can be used as CSP (Chip Size/Scale Package) with a small packaging area to permit high-density surface mounting of various types of semiconductor devices 103.

However, this type of conventional BGA package 101 had the problem that a solder resist layer 109 made of a resin such as polyimide on the back surface of the printed wiring board 102 as shown in FIG. 4b expands or contract during temperature cycling tests, for example, to cause a stress in the solder balls 104, which invites microcracks lowering the reliability of connection to a mother board, because the solder resist layer 109 is designed to come into contact with the solder balls 104 in the conventional BGA package 101.

In order to solve this problem, a BGA package was proposed wherein the diameter of the lands 108a of the conductive pattern 108 formed on the back surface of the printed wiring board 102 is reduced and the solder resist layer 109 is kept out of contact with the lands 108a, as shown in FIG. 4c, for example.

However, the conventional example shown in FIG. 4c had the problem that an opening 110 formed in the solder resist layer 109 to receive solder balls 104 should have a diameter comparable to the diameter of the solder ball 104, which hinders fine-pitch packaging.

Another problem of this conventional example is that the printed wiring board 102 must have great rigidity and thickness to reliably retain the lands 108a because the solder resist layer 109 is not designed to overlap the periphery of each land 108a for receiving a solder ball 104, whereby it was difficult to construct with a thin substrate made of a resin such as polyimide.

If such a structure as shown in FIG. 4c is applied to a thin substrate with low rigidity made of a resin such as polyimide, the pattern of the land 108a may be peeled or a plating layer on the surface of the land 108a may be peeled. As a result, it was difficult to obtain a thin and light BGA package with such a structure.

The present invention was made to solve these problems of the prior art, particularly with the object of providing a BGA package substrate capable of forming a thin and light BGA package which causes no crack in solder balls during temperature cycling tests and which permits fine-pitch packaging.

SUMMARY OF THE INVENTION

In order to attain the above object, the invention of claim 1 provides a BGA package substrate comprising an electrode for connection to an IC and an electrode for connection to a mother board on a circuit board consisting of a conductive circuit formed on an insulating base wherein at least said electrode for connection to a mother board is in the form of a solder ball, characterized in that an opening is formed in said insulating base in such a manner that the periphery of a connecting land to be formed the solder ball-like electrode thereon of said conductive circuit may be overlapped by said insulating base and that an end of said opening in said insulating base is tapered.

According to the invention, the tapered end of the opening in the insulating base allows the area of the end of the opening to be greater than the area of the connecting land exposed at the bottom, with the result that the solder ball-like electrode can be kept out of contact with the end of the opening of the insulating base even if the opening is formed in the insulating base to leave an overlap on the periphery of the connecting land.

Accordingly, the invention prevents any microcrack due to stress during temperature cycling tests in the solder ball-like electrode.

There is no possibility that the conductive pattern on the connecting land portion might be peeled or the plating layer on the surface of said land might be peeled even if a thin resin is used as an insulating base, because the connecting land is retained by the insulating base.

In this case, the invention is effective when the angle of the taper is 70° or less with the connecting land of the conductive circuit.

According to the invention, contacts between the end of the opening of the insulating base and the solder ball-like electrode can be more reliably prevented.

BRIEF DESCRIPTION OF THE DRAWINGS

A preferred embodiment of BGA package substrate according to the present invention will now be described in detail with reference to the accompanying drawings in which.

Figure 1A:
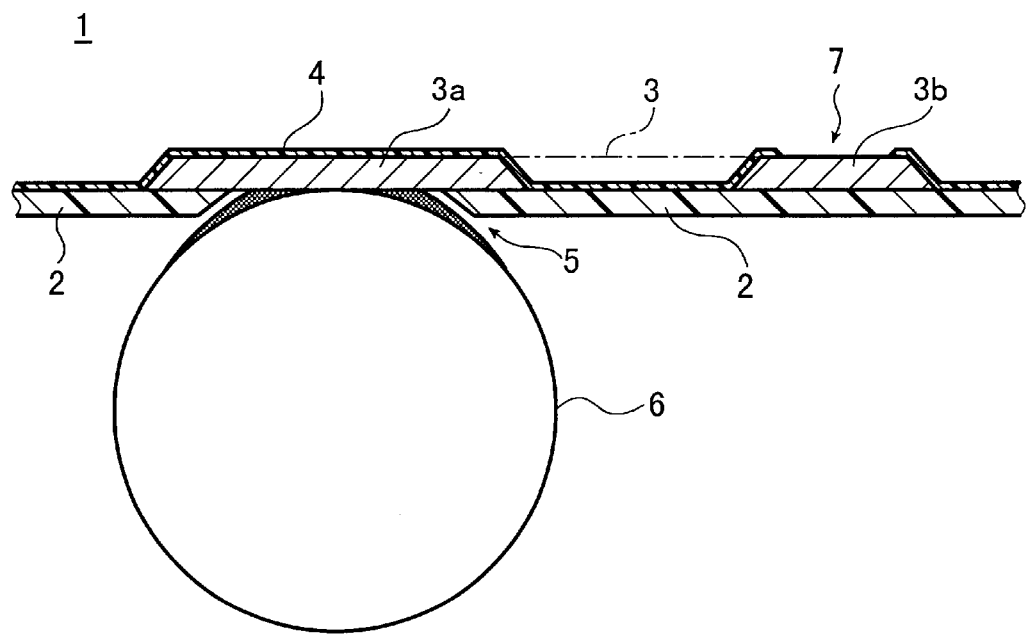
FIG. 1a is a partial sectional view showing the structure of a preferred embodiment of BGA package substrate according to the present invention.

Numeral references in the drawings represent the following elements:
1: BGA package substrate; 2: solder resist layer (insulating base); 3: conductive pattern (conductive circuit); 3a: land (connecting land); 3b: bonding pad; 4: cover film; 5: opening; 6: solder ball (solder ball-like electrode); 20: open end.

DETAILED DESCRIPTION OF THE INVENTION

FIG. 1a is a partial sectional view showing the structure of the present embodiment.

As shown in FIG. 1a, a BGA package substrate 1 according to the present embodiment comprises a conductive pattern (conductive circuit) 3 formed of, for example, copper on a solder resist layer (insulating base) 2 made of, for example, polyimide, and a cover coat layer 4 formed of, for example, polyimide on said conductive pattern 3.

As shown in FIG. 1a, the conductive pattern 3 includes a land (connecting land) 3a for receiving a solder ball 6 for connection to a mother board and a bonding pad 3b for connection to an IC, so as to ensure electric connection to said mother board and IC.

The land 3a for connection to a mother board is circular and a circular opening 5 with a smaller diameter than that of the land 3a is formed at the part of the solder resist layer 2 corresponding to the land 3a. Thus, the present embodiment has a structure wherein the solder resist layer 2 overlaps the periphery of the land 3a. A solder ball 6 for mounting the BGA package substrate 1 on the surface of a mother board (not shown) is formed on the surface of the land 3a exposed at the bottom of the opening 5.

An opening 7 is also formed at the part of the cover coat layer 4 corresponding to the bonding pad 3b for connection to an IC, whereby a bonding wire (not shown) connected to, for example, an electrode of an IC chip may be connected to the surface of the bonding pad 3b exposed at the bottom of the opening 7.

Figure 1B:
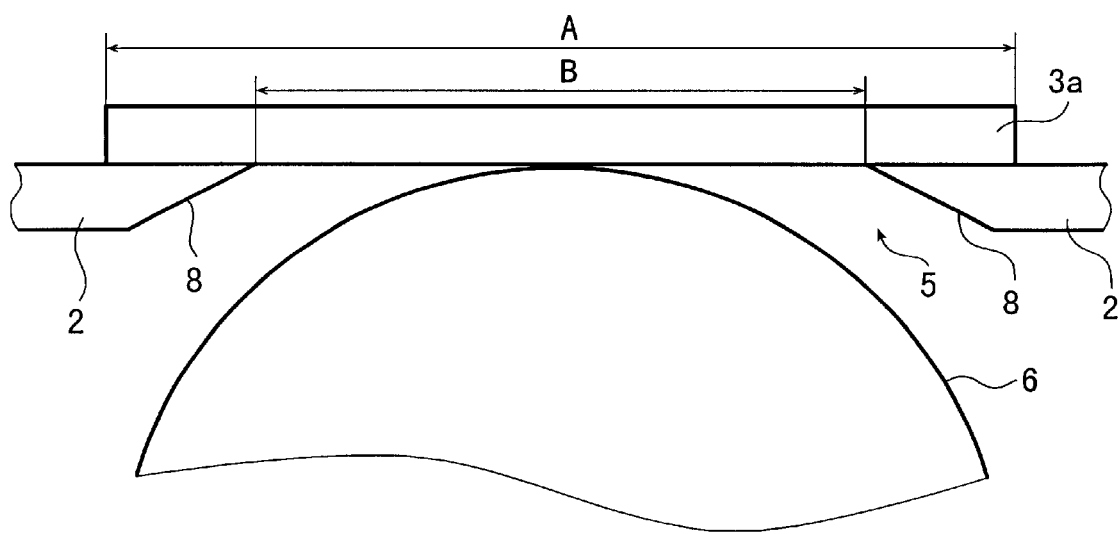
FIG. 1b is a schematic structural view showing a main part of the same embodiment.

FIG. 1b is a schematic structural view showing a main part of the present embodiment.

As shown in FIG. 1b, the diameter A of the land 3a is about 0.3 mm, and the diameter B of the opening 5 of the solder resist layer 2 is about 0.2 mm, according to the present embodiment.

According to the present embodiment, an end of the opening (hereinafter referred to as "open end") of the solder resist layer 2 has a taper 8 with a given angle as described below.

Figure 2:
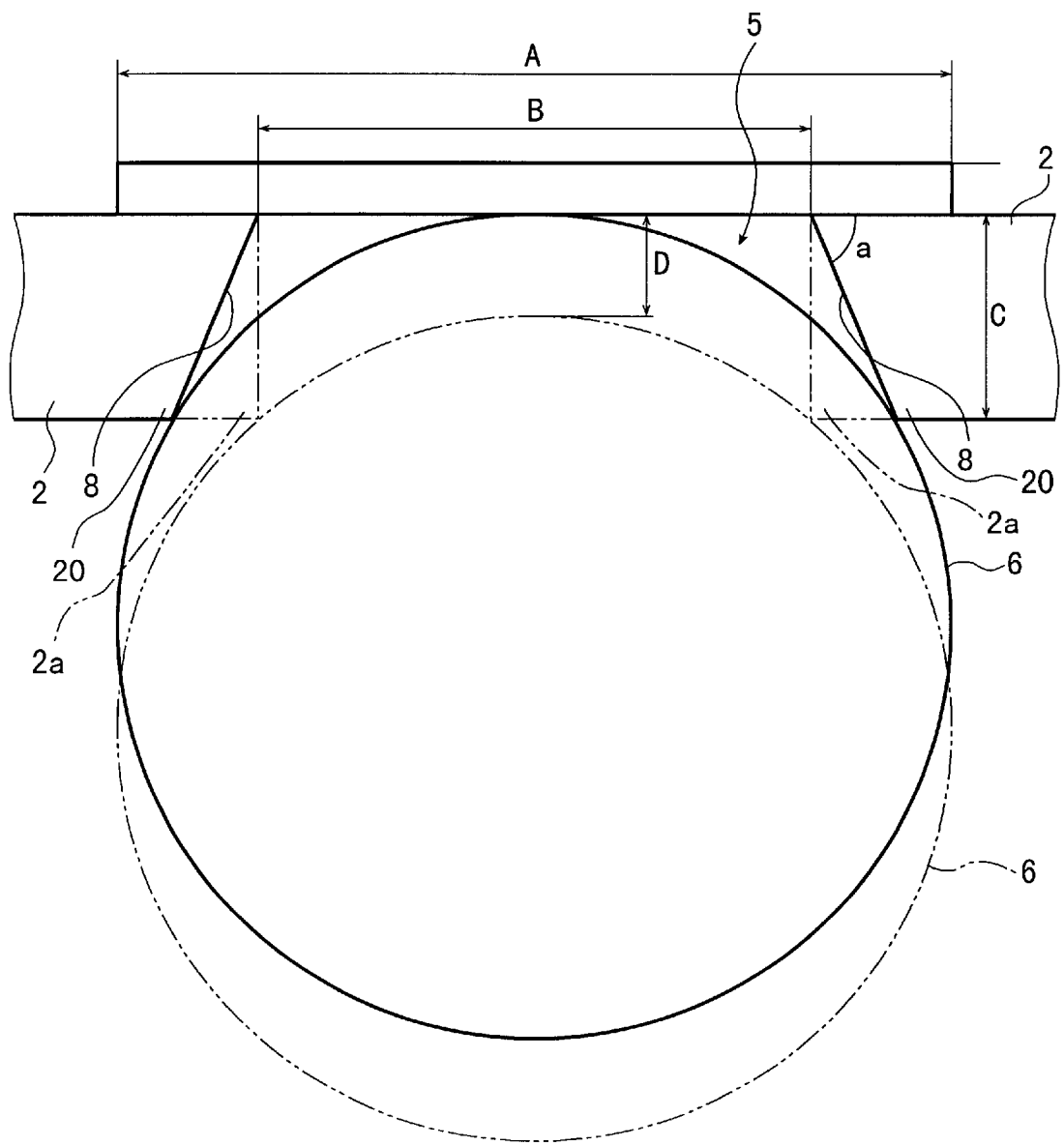
FIG. 2 is an explanatory view showing the positional relationship between an open end of the solder resist layer and a solder ball in the same embodiment.

FIG. 2 shows the positional relationship between the open end of the solder resist layer 2 and a solder ball 6.

Here will be explained an example in which the diameter of the solder ball 6 is 0.3 mm, the diameter of the opening 5 of the solder resist layer 2 is 0.2 mm and the thickness C of the solder resist layer 2 is 75 $\mu$m.

If the opening of the solder resist layer 2 is formed by cutting with a drill or other tools or laser cutting, the inner wall of the opening 5 of the solder resist layer 2 forms a right angle with the surface of the land 3a, as indicated by dash and two dot-lines in FIG. 2. When the solder ball 6 here comes into contact with the open end 2a of the solder resist layer 2, the solder ball 6 is placed at a distance of D=37 $\mu$m from the surface of the land 3a. Thus, the thickness C of the solder resist layer 2 must be smaller than 37 $\mu$m in order to avoid contact between the solder ball 6 and the open end 2a of the solder resist layer 2 if the solder resist layer has such an opening 5.

If the thickness C of the solder resist layer 2 is 75 $\mu$m and the inner wall of the opening 5 has a taper 8 with a taper angle $\alpha$ (an angle of the taper 8 with the surface of the land 3a) of less than about 70° as shown in FIG. 2, however, the area of the open end 20 becomes greater than the area of the land 3a exposed at the bottom, so that the solder ball 6 can be placed on the land 3a without being contacted with the open end 20 of the solder resist layer 2.

The angle of the taper 8 here also is influenced by the rigidity of the solder resist layer 2. When the solder resist layer 2 is made of polyimide as in the present embodiment, the angle is preferably in the range of 25°–45°.

If the angle of the taper 8 is smaller than 25°, the rigidity of the solder resist layer 2 will be lowered or the conductive pattern 3 on the land 3a will be readily peeled. If the angle of the taper 8 is greater than 70°, however, the solder ball 6 will come into contact with the open end 20 of the solder resist layer 2, as described above. The angle of the taper 8 is preferably in the range of 25°–45° in terms of production variability.

In view of the above, the thickness of the solder resist layer 2 is preferably 10–50 $\mu$m, more preferably 15–30 $\mu$m.

The thickness of the cover coat layer is preferably 1–30 $\mu$m, more preferably 2–10 $\mu$m.

FIGS. 3a to h show a flow sheet showing successive steps of an example of process for producing a BGA package substrate according to the present embodiment.

Figure 3A:
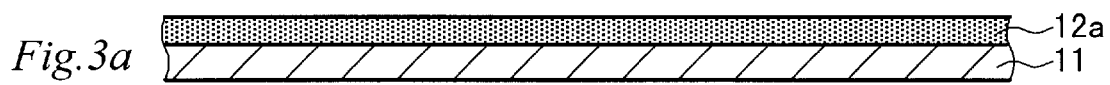
FIGS. 3a–h is a flow sheet showing successive steps of an example of process for producing a BGA package substrate according to the same embodiment.

At first, a copper foil 11 having a somewhat greater area than that of an IC chip is prepared, and a mixed polyamic acid solution which is a precursor of polyimide is coated all over the upper surface of the copper foil 11 and thermally dried to form a polyamic acid layer 12a, as shown in FIG. 3a.

The thickness of the copper foil 11 is not specifically limited, but preferably about 6–35 $\mu$m, more preferably 12–18 $\mu$m.

The thickness of the polyamic acid layer 12a is preferably about 10–50 $\mu$m, more preferably 15–30 $\mu$m.

Figure 3B:
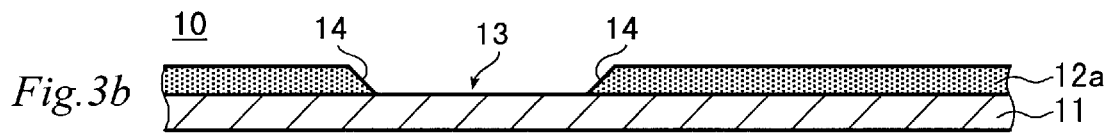

Then, an opening 13 for receiving a solder ball is formed by a known photolithography process at a given part of the polyamic acid layer 12a, as shown in FIG. 3b.

Namely, a photoresist is applied on the polyamic acid layer 12a, dried and then exposed and developed to form a predetermined resist pattern (not shown), after which the part corresponding to the opening 13 is etched with an alkaline solution and washed with warm water, then the resist pattern is removed. Thus, a taper 14 with an angle of about 45° is formed at the open end of the polyamic acid layer 12a.

The etching speed for forming the opening 13 is preferably about 1–4 m/min. The higher the etching speed, the smaller the angle of the taper.

In order to optimize the angle of the taper 14, the temperature of the washing warm water is preferably 30–45° C. The higher the temperature of the washing warm water, the greater the angle of the taper.

The substrate 10 is heated at a temperature of about 350–400° C. for about 5 minutes to complete the imidization of polyamic acid, followed by curing.

Figure 3C:
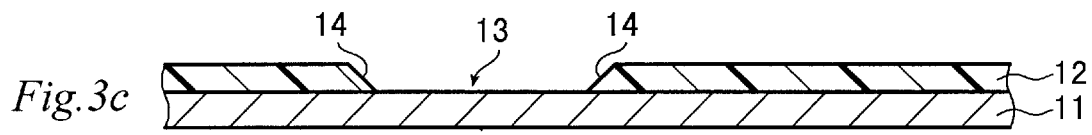

Thus, a polyimide layer 12 having an opening 13 at a part for receiving a solder ball is formed on the upper surface of the copper foil 11, as shown in FIG. 3c.

Figure 3D:
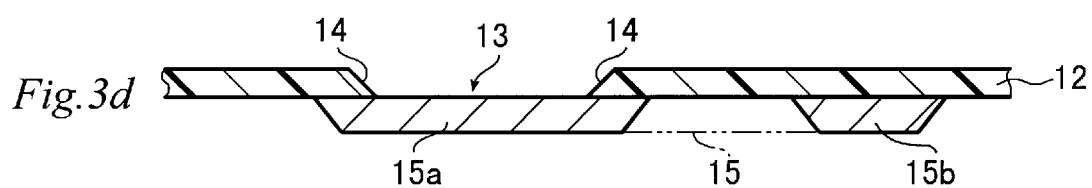

Then, the copper foil 11 is etched to leave a given pattern by subjecting the back surface of the copper foil 11 to a known photolithography process to form a conductive circuit 15 on the polyimide layer 12 (FIG. 3d).

As shown in FIG. 3d, the conductive circuit 15 formed on the polyimide layer 12 includes a land 15a for receiving a solder ball 18 for connection to a mother board and a bonding pad 15b for connection to an IC chip to ensure electric connection to such mother board and IC chip.

Figure 3E:
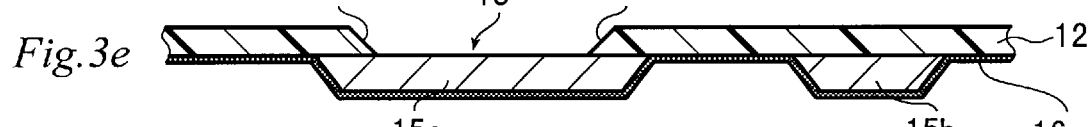

Then, the above mixed polyamic acid solution is coated all over the back surface of the copper foil 11 to form a polyamic acid layer 16a, as shown in FIG. 3e.

The thickness of the polyamic acid layer 16a here is preferably 1–30 μm, more preferably 2–10 μm.

Figure 3F:
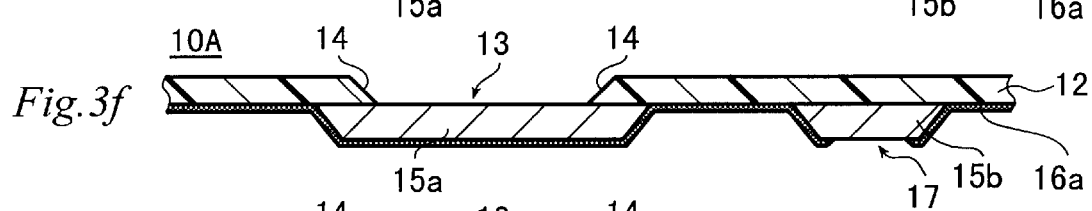

Then, an opening 17 is formed by said photolithography process at the part of the polyamic acid layer 16a corresponding to the bonding pad 15a, as shown in FIG. 3f, and the substrate 10A is heated at a temperature of about 350–400° C. for about 5 minutes to complete the reaction from polyamic acid to polyimide, followed by curing.

Figure 3G:
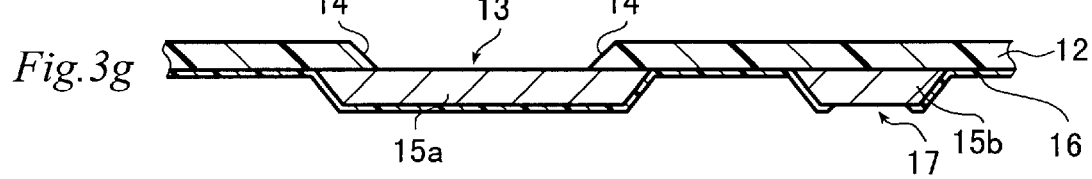

Thus, a polyimide layer 16 having an opening 17 on the surface of the bonding pad 15b is formed on the lower face of the copper foil 11, as shown in FIG. 3g.

Then, a solder ball 18 with a flux is mounted on each land 15a using, for example, a known solder ball transfer technique and subjected to reflow soldering to provide the solder ball 18 on each land 15a.

Figure 3H:
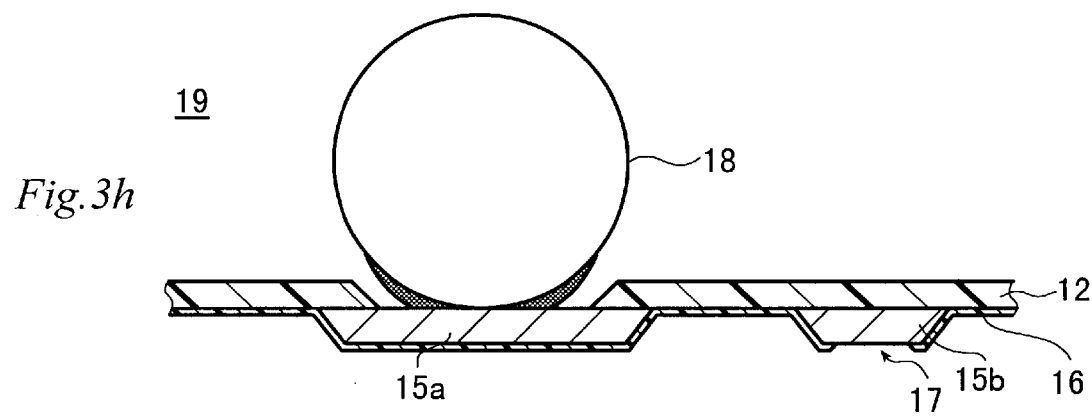
Figure 4A:
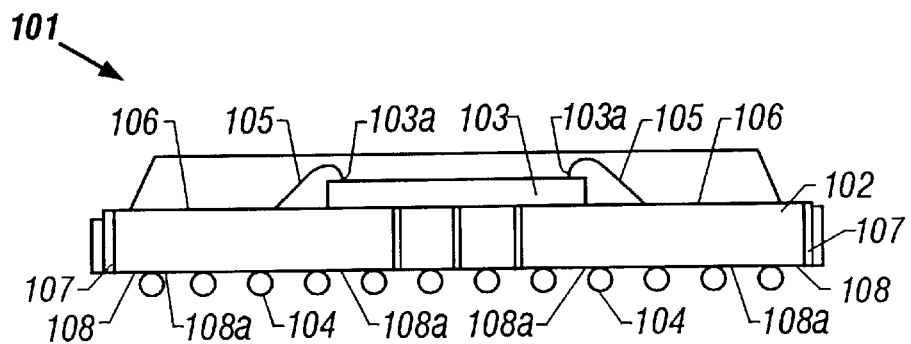
FIG. 4a is a schematic structural view showing an example of conventional BGA package.
Figure 4B:
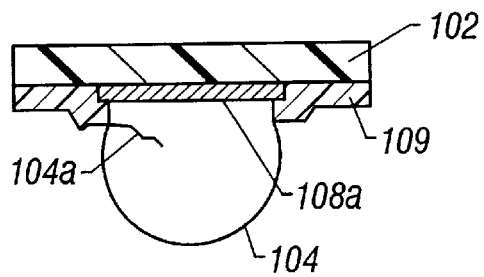
FIG. 4b is a partial sectional view showing an example of conventional solder resist layer.
Figure 4C:
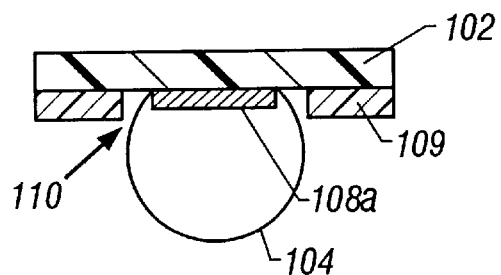
FIG. 4c is a partial sectional view showing another example of conventional solder resist layer.

Thus, a BGA package substrate 19 with the above structure is obtained as shown in FIG. 3h.

As described above, the present embodiment provides a taper 8 at an end of the opening 5 of the solder resist layer 2 to allow the area of the open end 20 of the solder resist layer 2 to be greater than the area of the land 3a exposed at the bottom, with the result that the solder ball 6 can be kept out of contact with the open end 20 of the solder resist layer 2 even though the solder resist layer 2 is formed to overlap the periphery of the land 3a of the conductive pattern 3 as described above.

Accordingly, the present embodiment can avoid microcrack in the solder ball 6 during temperature cycling tests (for example, the temperature and humidity cycling test according to MIL-STD-883: temperature 10–65° C., humidity 80–100% RH, etc.). Peeling of the land 3a or other problems do not occur because the land 3a is retained by the solder resist layer 2, whereby a thin and light BGA package can be constructed with a resin such as polyimide.

The present invention is not limited to the above embodiment but may encompass various modifications.

For example, the present invention can be applied to various sizes without being limited to the above embodiment in which the diameter of the land of the conductive pattern is 0.3 mm, the diameter of the opening of the solder resist layer is 0.2 mm and the diameter of the solder ball is 0.3 mm.

However, the size of the overlap (overlap of the land and the solder resist layer) is preferably about 20 μm or more, and the distance between the solder ball and the open end of the solder resist layer is preferably 2–3 μm or more.

After the opening for connection to a solder ball has been formed in the solder resist layer, the surface of the land of the conductive pattern may be subjected to soft-etching by increasing the line speed or decreasing the time of passing the substrate through an etching solution, for example.

Such mild etching treatment roughens the surface of the land to increase its surface area, so that the adhesion strength to the solder ball is enhanced to improve connection reliability.

Furthermore, the bonding pad for connection to an IC may accomplish a connection via an anisotropic conductive film (ACF) or a solder ball similarly to the land for connection to a mother board. When the connection takes place via a solder ball, the opening of the cover film may also be tapered as above.

As described above, the present invention can avoid microcrack in solder balls during temperature cycling tests. Moreover, peeling of connecting lands or other problems do not occur because connecting lands of the conductive circuit are retained by an insulating base, whereby a thin and light BGA package can be constructed.

What is claimed is:

1. A BGA package substrate adapted for use with a solder ball having a diametrical dimension, said BGA package substrate comprising:

an insulating base having first and second opposed major surfaces, a conductive land disposed on the second major surface, a tapered opening defined in the insulating base extending from the first major surface to the second major surface and exposing a portion of the conductive land, said tapered opening having a taper angle, α, defined between the conductive land and an angled sidewall of the tapered opening such that $70° \geq \alpha \geq 25°$, said tapered opening further having a diametrical dimension smaller than the diametrical dimension of said solder ball, and said tapered opening being configured so that the periphery of the tapered opening adjacent the first major surface does not contact or interfere with circumferential portions of said solder ball when the solder ball is brought into contact with exposed portions of the conductive land within the tapered opening.

2. A BGA package substrate as defined in claim 1, wherein the taper angle, α, is selected such that $45° \geq \alpha \geq 25°$.

3. A thin, light weight BGA package substrate consisting essentially of:

an insulating base having first and second opposed major surfaces, a conductive land disposed on the second major surface, a tapered opening defined in the insulating base extending from the first major surface to the second major surface and exposing a portion of the conductive land, wherein a taper angle, α, defined between the conductive land and an angled sidewall of the tapered opening has a value such that $45° \geq \alpha \geq 25°$; and a cover coat layer disposed on the second major surface and the conductive land.

4. A thin, light weight BGA package substrate as defined in claim 3, wherein the conductive land and the cover coat layer are disposed such that the conductive land and the cover coat layer have an overlap of greater than or equal to about at least 20 μm.

5. A method for making a BGA package substrate comprising the steps of:

(a) providing a conductive sheet layer;

(b) forming an insulating base on a first major surface of the conductive sheet layer;

(c) removing a portion of the insulating base so as to define at least one tapered opening extending from a second major surface of the insulating base to a first major surface and exposing a portion of the conductive sheet layer, said tapered opening including a taper angle, α, defined between the conductive sheet layer and an angled sidewall of the tapered opening, such that $70° \geq \alpha \geq 25°$;

(d) removing portions of the conductive sheet layer to define at least one conductive land on a first major surface of the insulating base overlapping said tapered opening; and (e) forming a cover coat layer on the first major surface of the insulating base and the conductive land to provide a said BGA package substrate.

6. A method as defined in claim 5, wherein said taper angle, α, has a value such that $45° \geq \alpha \geq 25°$.

* * * * *